(12) United States Patent
Tseng et al.

(10) Patent No.: US 7,642,571 B2
(45) Date of Patent: Jan. 5, 2010

(54) SUBSTRATE CORE

(75) Inventors: Tzyy-Jang Tseng, Hsinchu (TW); Chih Ming Chang, Tainan (TW); Cheng Po Yu, Jhongli (TW); Chung W. Ho, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 247 days.

(21) Appl. No.: 11/128,768

(22) Filed: May 12, 2005

(65) Prior Publication Data

US 2006/0113658 A1    Jun. 1, 2006

(30) Foreign Application Priority Data

Nov. 29, 2004   (TW) .............................. 93136687 A

(51) Int. Cl.
  *H01L 27/10*    (2006.01)
(52) U.S. Cl. ............... 257/211; 257/698; 257/E23.011; 257/E23.145

(58) Field of Classification Search ................ 257/698, 257/758, 762, 201, E23.011, E23.145
See application file for complete search history.

(56) References Cited

U.S. PATENT DOCUMENTS

| 5,712,448 A | 1/1998 | Vandersande et al. ....... 136/203 |
| 6,121,539 A | 9/2000 | Johnson et al. .............. 136/203 |
| 2002/0041013 A1* | 4/2002 | Wakamiya et al. .......... 257/678 |
| 2003/0064584 A1* | 4/2003 | Dujari et al. ................. 438/667 |
| 2005/0121793 A1* | 6/2005 | Liaw ........................... 257/758 |
| 2005/0230795 A1* | 10/2005 | Furuyama et al. ........... 257/678 |

* cited by examiner

*Primary Examiner*—Hoai v Pham
(74) *Attorney, Agent, or Firm*—J.C. Patents

(57) ABSTRACT

A substrate including a first patterned metallic layer, a second patterned metallic layer and an insulator is provided. One side of the first patterned metallic layer is connected to a corresponding side of the second patterned metallic layer. The first patterned metallic layer and the second patterned metallic layer are formed as a whole. The insulator fills the gaps in the first patterned metallic layer and the gaps in the second patterned metallic layer.

11 Claims, 4 Drawing Sheets

SUBSTRATE CORE

CROSS-REFERENCE TO RELATED APPLICATION

This application claims the priority benefit of Taiwan application serial no. 93136687, filed on Nov. 29, 2004. All disclosure of the Taiwan application is incorporated herein by reference.

BACKGROUND OF THE INVENTION

1. Field of the Invention

The present invention relates to a substrate core and method for fabricating the same. More particularly, the present invention relates to a substrate core having high thermal conductivity and high electrical conductivity and a method of fabricating the same.

2. Description of the Related Art

The information technology products in this business world have becoming increasingly important. As new models continue to be introduced, current electronic products not only offer diversifying functions but have developed to be more miniaturized, with the operating performance upgraded to be more stable. As the electronic products become miniaturized, heat dissipation has become a major issue in high power chips, such as microprocessors or light-emitting diodes, because a stable operation depends on the rapid heat dissipation from the heat generating sources. For a chip packaging structure having a chip on a substrate, the substrate is one of the principal channels for dissipating heat from the chip. Therefore, the thermal properties of the substrate will directly affect the reliability of the chip operation.

FIG. 1 is a schematic cross-sectional view of a conventional substrate. To fabricate the substrate shown in FIG. 1, a core layer 110 is provided and then a plurality of holes 112 passing through the core layer 110 are formed. Thereafter, a reverse oxidation reaction and an electroplating process are performed to form metallic layers 122, 124, 126 on the top/bottom surface of the core layer 110 as well as the inner wall of the hole 112. After that, photolithography and etching processes are performed to pattern the metallic layers 122 and 124. Then, insulation layers 132, 134, 136, 138 and patterned metallic layers 142, 144 are separately formed on each side of the core layer 110. Through the metallic layers 122, 124 and 126, the patterned metallic layers 142 and 144 on each side of the core layer 110 can be electrically connected.

In the aforementioned substrate 100, the metallic layer 126 with good thermal conductivity is formed only on the inner wall of the hole 112 in the core layer 110 without filling the entire hole 112. When heat is transferred from one side of the core layer 110 to the other, the amount of heat conducted through the metallic layer 126 is quite limited because the cross-sectional area of the metallic layer 126 perpendicular to the thermal path is relatively small. In other words, the metallic layer 126 inside the hole 112 can not provide optimal heat dissipation effect and electrical performance.

SUMMARY OF THE INVENTION

Accordingly, at least one objective of the present invention is to provide a substrate having high thermal conductivity and electrical conductivity.

At least a second objective of the present invention is to provide a method of fabricating a substrate with high thermal conductivity and electrical conductivity.

To achieve these and other advantages and in accordance with the purpose of the invention, as embodied and broadly described herein, the invention provides a substrate comprising a first patterned metallic layer, a second patterned metallic layer and an insulator. One side of the first patterned metallic layer is connected to a corresponding side of the second patterned metallic layer. The first patterned metallic layer and the second patterned metallic layer are formed as a whole. The insulator is disposed in the gaps in the first patterned metallic layer and the gaps in the second patterned metallic layer.

The present invention also provides a method of fabricating a substrate including the following steps. First, a metallic board having a first surface and a corresponding second surface is provided. Thereafter, a half-etching process is carried out to etch the first surface of the metallic board to a first depth and form a first patterned metallic layer on the first surface. Then, a first insulator is deposited to fill the gaps in the first patterned metallic layer. After that, a second half-etching process is carried out to etch the second surface of the metallic board to a second depth so that at least a portion of the insulator is exposed and a second patterned metallic layer is formed on the first surface. The first depth and the second depth together equal to the thickness of the metallic board. Finally, a second insulator is deposited to fill the gaps in the second patterned metallic layer.

In the present invention, the circuit lines in the first patterned metallic layer and the second patterned metallic layer are solid. When heat is transferred from one side of the substrate to the other, the solid first patterned metallic layer and second patterned metallic layer having a larger junction area can increase the cross-sectional area of the thermal conductive path and thus improve effective heat dissipation. Furthermore, because the circuits in the solid first patterned metallic layer and the second patterned metallic layer are directly connected, the cross-sectional area perpendicular to the signal transmission path is larger so that the electrical performance of the substrate is also improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
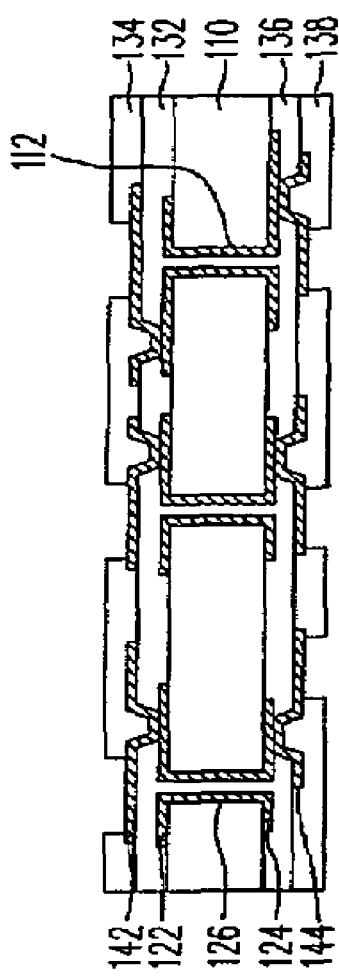
FIG. 1 is a schematic cross-sectional view of a conventional substrate.

Reference will now be made in detail to the present embodiments of the invention, examples of which are illustrated in the accompanying drawings. Wherever possible, the same reference numbers are used in the drawings and the description to refer to the same or like parts.

Figure 2:
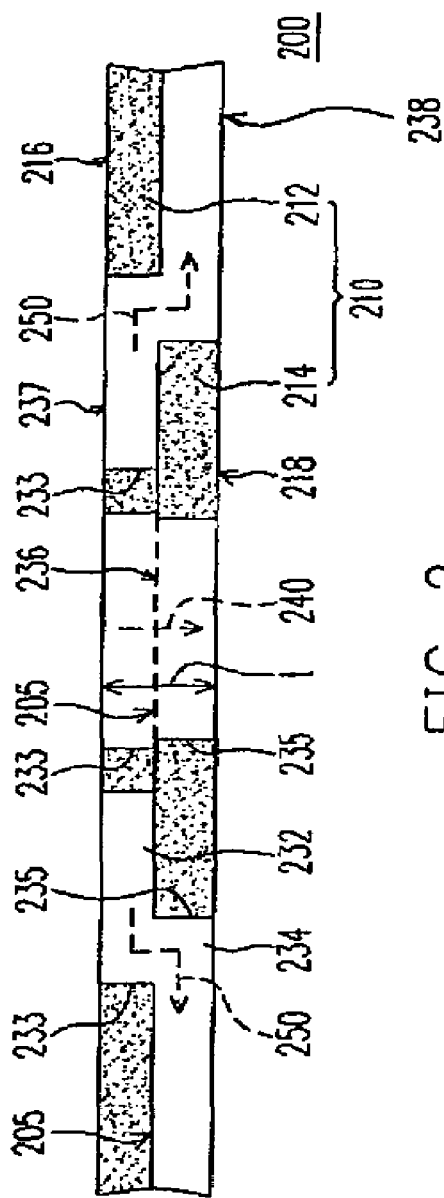
FIG. 2 is a schematic cross-sectional view of a substrate according to one embodiment of the present invention.

FIG. 2 is a schematic cross-sectional view of a substrate according to one embodiment of the present invention. As shown in FIG. 2, the substrate 200 comprises an insulator 210 and a pair of patterned metallic layers 232 and 234. The patterned metallic layers 232 and 234 have gaps 233 and 235, respectively. The gap 233 is linked with the gap 235. The gap 233 exposes the patterned metallic layer 234 while the gap 235 exposes the patterned metallic layer 232. The circuit layout of the patterned metallic layer 232 is different from that of the patterned metallic layer 234. The insulator 210, for example, comprises two insulation layers 212 and 214 that fill up the gaps 233 and 235 of the patterned metallic layers 232 and 234, respectively. The insulator 210 has a top surface 216 and a corresponding bottom surface 218. The top surface 216 of the insulator 210 and the top surface 237 of the patterned metallic layer 232 are coplanar. Similarly, the bottom surface 218 of the insulator 210 and the bottom surface 238 of the patterned metallic layer 234 are coplanar. The bottom surface 205 of the patterned metallic layer 232 and the top surface of the patterned metallic layer 234 are overlapped. In other words, the two structures are joined face-to-face as a whole.

The patterned metallic layers 232 and 234 are fabricated using copper, aluminum or stainless steel, for example. Furthermore, the patterned metallic layers 232 and 234 are connected to each other. In the present embodiment, the patterned metallic layers 232 and 234 have a total thickness t between about 0.25 mm to 3.0 mm.

The circuits in the patterned metallic layers 232 and 234 are solid lines and connected together as a whole. When heat is transferred from one side to the other side of the substrate 200, the cross-sectional area of the thermal path 240 and 250 is increased because the solid patterned metallic layers 232 and 234 can provide a larger junction area. Hence, a higher cooling rate is provided. Furthermore, because the solid patterned metallic layers 232 and 234 can provide circuit lines with larger junction areas, the cross-sectional area of the circuit lines for transmitting signals is also increased, leading to better electrical performance.

In one embodiment of the present invention, the substrate 200 has a chip pad 236, with a heating source such as a high power chip or a light-emitting diode chip disposed thereon. In general, the chip is fabricated using silicon (Si), gallium arsenide (GaAs) or germanium (Ge). Since the chip pad 236 is made of solid patterned metallic layers 232 and 234, it has a larger cross-sectional area perpendicular to the heat dissipation pathway 240. Hence, the chip pad 236 can provide higher heat dissipation effect.

Figure 3:
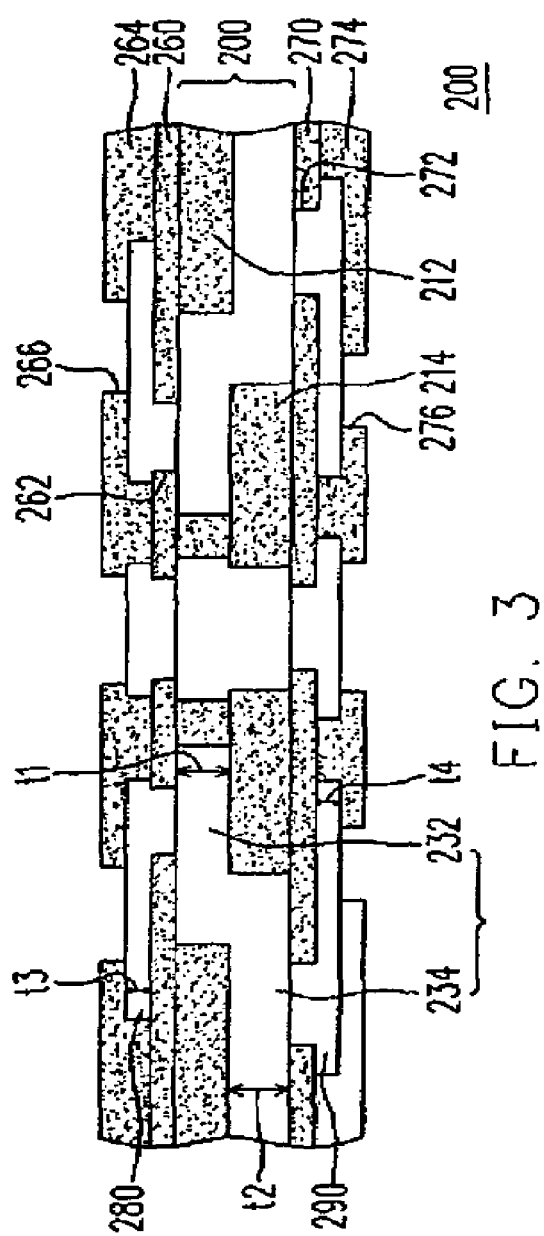
FIG. 3 is a schematic cross-sectional view of a substrate according to another embodiment of the present invention.

However, the applications of the present invention is not limited as such. FIG. 3 is a schematic cross-sectional view of a substrate according to another embodiment of the present invention. As shown in FIG. 3, the substrate 200 may further comprise two dielectric layers 260 and 270 and another two patterned metallic layers 280 and 290. The dielectric layers 260 and 270 are disposed on the insulation layers 212 and 214 and the patterned metallic layers 232 and 234 respectively. The patterned metallic layers 280 and 290 are disposed on the dielectric layers 260 and 270 respectively. The dielectric layers 260 and 270 have a plurality of conductive vias 262 and 272. The patterned metallic layers 280 and 290 are electrically connected to the patterned metallic layers 232 and 234 through the conductive vias 262 and 272 respectively. In the present embodiment, the patterned metallic layers 232 and 234 have a thickness t1 and t2 greater than the thickness t3 and t4 of the patterned metallic layers 280 and 290, respectively.

The substrate 200 may further comprise two solder mask layers 264 and 274 disposed on the dielectric layers 260, 270 and the patterned metallic layers 280, 290, respectively. The solder mask layers 264 and 274 have a plurality of openings 266 and 276 that expose the patterned metallic layers 280 and 290.

However, the applications of the present invention are not limited as such. In practice, two or more dielectric layers and patterned metallic layers can be formed on the insulation layer 212 and the patterned metallic layer 232. Alternatively, two or more dielectric layers and patterned metallic layers can be formed on the insulation layer 214 and the patterned metallic layer 234. In addition, the applications of the present invention are not limited as such. The steps of forming dielectric layers and patterned metallic layers over the insulation layer 214 and the patterned metallic layer 234 can be entirely skipped. Alternatively, the steps of forming dielectric layers and patterned metallic layers over the insulation layer 212 and the patterned metallic layer 232 can be entirely skipped. In other words, the aforementioned patterned metallic layers 232 and 234 may serve as a core layer for stacking other patterned metallic layers, with each pair of patterned metallic layer isolated by an insulation layer, on both sides or either side of the core layer. The additional patterned metallic layers are electrically connected through conductive vias to form a multi-layered circuit substrate.

In addition, the substrate of the present invention can be electrically connected to a chip using a variety of methods. For example, the chip may be electrically connected with the substrate of the present invention using a flip-chip bonding method or a wire-bonding method.

Figure 4:
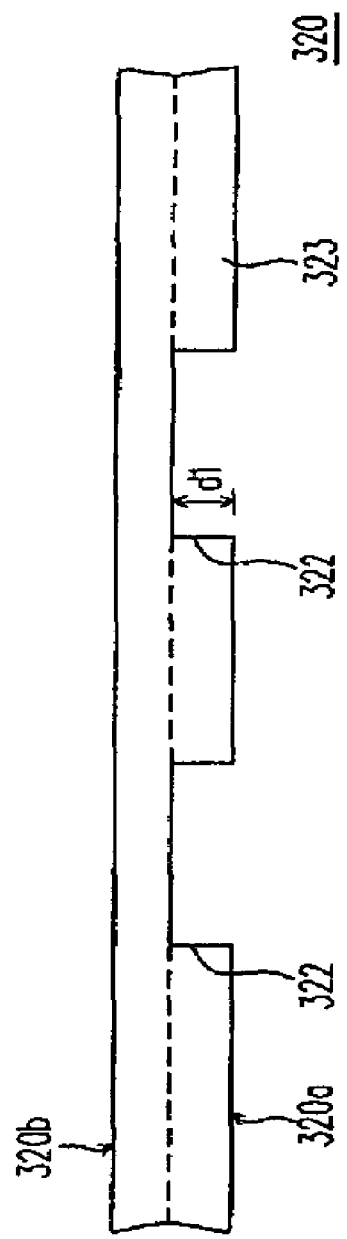
FIGS. 4 through 7 are schematic cross-sectional views showing the steps for fabricating a substrate according to one embodiment of the present invention.

FIGS. 4 through 7 are schematic cross-sectional views showing the steps for fabricating a substrate according to one embodiment of the present invention. As shown in FIG. 4, a metallic board 320 having a first surface 320a and a corresponding second surface 320b is provided. Thereafter, a first half-etching process is carried out to etch the first surface 320a of the metallic board 320 to a first depth d1 to form a patterned metallic layer 340 on the first surface 320a. The first half-etching process includes the following steps. First, a photoresist layer (not shown) is formed over the first surface 320a and the second surface 320b. Then, the photoresist layer on the first surface 320a is exposed and developed to form a patterned photoresist layer that exposes a portion of the first surface 320a. Thereafter, using the photoresist layer as a mask, an etching process is carried out to etch the exposed surface of the metallic board 320 to a depth d1 and form a patterned metallic layer 323 and gaps 322 between the patterned metallic circuit lines. Finally, the photoresist layer is removed.

Figure 5:
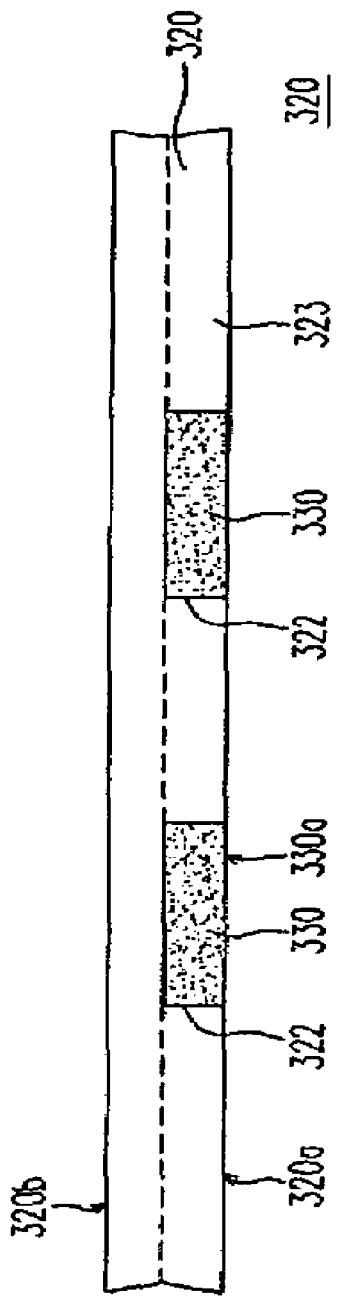

As shown in FIG. 5, polymer material is then injected into the gaps 322 and then thermally cured to form an insulator 330. Thereafter, a polishing operation can be carried out to polish the patterned metallic layer 323 and the insulator 330 protruding outside the gaps 322 until the top surface 330a of the insulator 330 and the surface 320a of the patterned metallic layer 323 are coplanar. However, the applications of the present invention are not limited as such. The step of polishing the patterned metallic layer 323 and the insulator 330 can be skipped.

Figure 6:
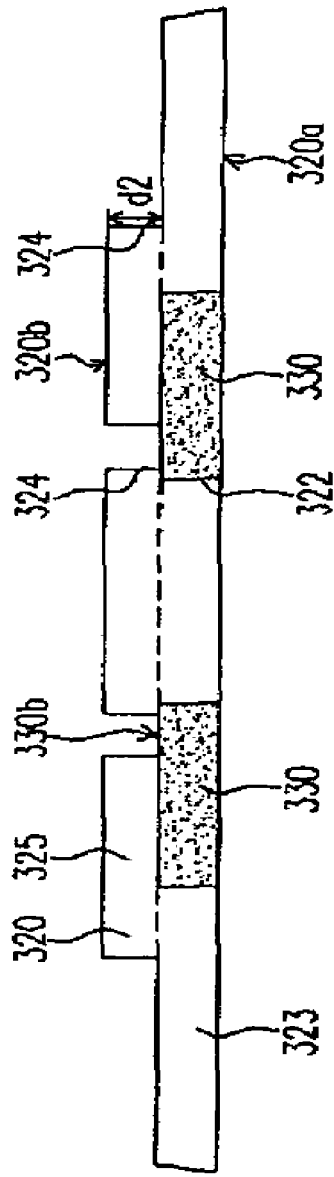

As shown in FIG. 6, a second half-etching process is carried out to etch the second surface 320b of the metallic board 320 to a second depth d2 to expose at least a portion of the surface 330b of the insulator 330 and form a patterned metallic layer 325 on the second surface 320b. The first depth d1 and the depth d2 together equal to the thickness of the metallic board 320. In other words, the integrative unit including the patterned metallic layers 323 and 325 form the metallic board 320. The second half-etching process includes the following steps. First, a photoresist layer (not shown) is formed over the first surface 320a and the second surface 320b. Then, the photoresist layer on the second surface 320b is exposed and developed to form a patterned photoresist layer that exposes a portion of the second surface 320b. Thereafter, using the photoresist layer as a mask, an etching process is carried out to etch the exposed second surface 320b of the metallic board 320 to a depth d2 and form a patterned metallic layer 325 and gaps 324 between the patterned metallic circuit lines. Finally, the photoresist layer is removed.

Figure 7:
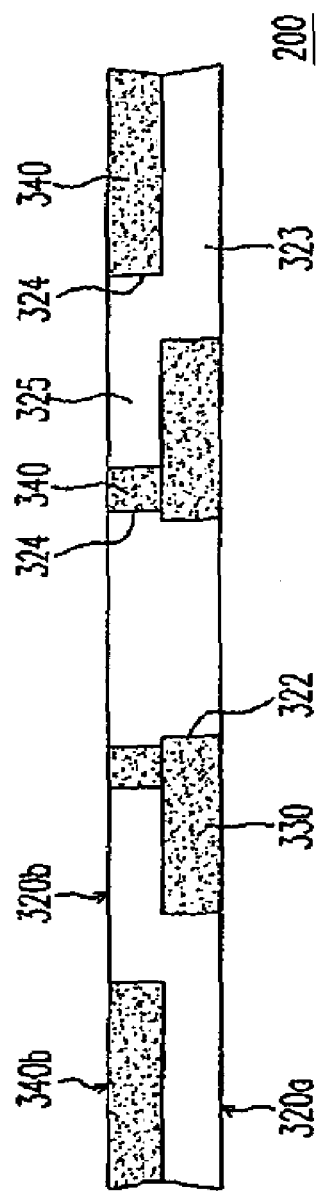

As shown in FIG. 7, a polymer material is injected into the gaps 324 and then thermally cured to form an insulator 340. Thereafter, a polishing operation can be carried out to polish the patterned metallic layer 325 and the insulator 340 protruding outside the gaps 324 until the top surface 340b of the insulator 340 and the surface 320b of the patterned metallic layer 325 are coplanar. However, the applications of the present invention are not limited as such. The step of polishing the patterned metallic layer 325 and the insulator 340 can be omitted.

Through the aforementioned processes, a substrate having a structure shown in FIG. 2 is formed. Thereafter, as shown in FIG. 3, a laminating operation or a built-up method can be used to form the dielectric layers 260, 270 and the patterned metallic layers 280, 290 on the substrate shown in FIG. 7. Hence, a substrate structure as shown in FIG. 3 is produced.

As shown in FIG. 3, the processing method may include forming the patterned dielectric layers 260, 270 over the insulator 210 and the patterned metallic layers 232, 234 and then forming the patterned metallic layers 280, 290 over the dielectric layers 260, 270 and the conductive vias 262, 272. Through the conductive vias 262 and 272, the patterned metallic layers 280, 290 can be electrically connected to the patterned metallic layers 232 and 234. After that, the patterned solder mask layers 264, 274 are formed over the dielectric layers 260, 270 and the patterned metallic layers 280, 290.

In summary, the present invention has at least the following advantages.

1. In the substrate of the present invention, the chip pads and circuit lines are fabricated by connecting solid patterned metallic layers face-to-face. Hence, the chip pads and the circuit lines can have larger cross-sectional areas perpendicular to the thermal conduction path to increase heat dissipation effect.
2. Because the core layer of the substrate is fabricated by connecting solid patterned metallic layers face-to-face, the core layer can have a larger junction area. In other words, the cross-sectional area for transmitting an electrical current is increased. Hence, the substrate can provide better electrical performance.
3. The method of fabricating the substrate according to the present invention can produce a substrate with higher thermal dissipation effect and better electrical performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate, comprising:
    a metallic board in a single layer with two structure portions comprising:
        a first patterned metallic layer; and
        a second patterned metallic layer, wherein one surface of the first patterned metallic layer is connected to a corresponding surface of the second patterned metallic layer such that the first patterned metallic layer and the second patterned metallic layer are the two structure portions as a single-body structure;
    an insulator having two portions formed of the same material respectively disposed in gaps in the first patterned metallic layer and the second patterned metallic layer; and
    a first dielectric layer and a third patterned metallic layer, wherein the first dielectric layer is disposed on the first patterned metallic layer and the insulator, the third patterned metallic layer is disposed on the first dielectric layer, and the first dielectric layer has at least a gap for electrically connecting the third patterned metallic layer to the first patterned metallic layer.

2. The substrate of claim 1, wherein the material constituting the first patterned metallic layer and the second patterned metallic layer comprises copper.

3. The substrate of claim 1, wherein the material constituting the first patterned metallic layer and the second patterned metallic layer comprises aluminum.

4. The substrate of claim 1, wherein the material constituting the first patterned metallic layer and the second patterned metallic layer comprises stainless steel.

5. The substrate of claim 1, wherein the first patterned metallic layer and the second patterned metallic layer have a total thickness between about 0.25 mm to about 3.0 mm.

6. The substrate of claim 1, further comprising a second dielectric layer and a fourth patterned metallic layer such that the second dielectric layer is disposed on the second patterned metallic layer and the insulator and the fourth patterned metallic layer is disposed on the second dielectric layer, and the second dielectric layer has at least a gap for electrically connecting the fourth patterned metallic layer to the second patterned metallic layer.

7. The substrate of claim 1, wherein the first patterned metallic layer has a thickness greater than that of the third patterned metallic layer.

8. The substrate of claim 1, wherein a surface of the first patterned metallic layer away from the second patterned metallic layer and a top surface of the insulator are coplanar.

9. The substrate of claim 8, wherein a surface of the second patterned metallic layer away from the first patterned metallic layer and a bottom surface of the insulator are coplanar.

10. The substrate of claim 1, wherein the one surface of the first patterned metallic layer is partly and directly connected to the corresponding surface of the second patterned metallic layer.

11. A substrate, comprising: a metallic board in a single layer with two structure portions comprising:
    a first patterned metallic layer; and
    a second patterned metallic layer, wherein one surface of the first patterned metallic layer is partly and directly connected to a corresponding surface of the second patterned metallic layer such that the first patterned metallic layer and the second patterned metallic layer are the two structure portions as a single-body structure;
    an insulator having two portions formed of the same material respectively disposed in gaps in the first patterned metallic layer and the second patterned metallic layer;
    a first dielectric layer and a third patterned metallic layer, wherein the first dielectric layer is disposed on the first patterned metallic layer and the insulator, the third patterned metallic layer is disposed on the first dielectric layer, and the first dielectric layer has at least a gap for electrically connecting the third patterned metallic layer to the first patterned metallic layer; and a second dielectric layer and a fourth patterned metallic layer such that the second dielectric layer is disposed on the second patterned metallic layer and the insulator and the fourth patterned metallic layer is disposed on the second dielectric layer, and the second dielectric layer has at least a gap for electrically connecting the fourth patterned metallic layer to the second patterned metallic layer.

* * * * *

UNITED STATES PATENT AND TRADEMARK OFFICE
CERTIFICATE OF CORRECTION

PATENT NO.        : 7,642,571 B2                                      Page 1 of 1
APPLICATION NO.   : 11/128768
DATED             : January 5, 2010
INVENTOR(S)       : Tseng et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 617 days.

Signed and Sealed this

Sixteenth Day of November, 2010

David J. Kappos
*Director of the United States Patent and Trademark Office*